(12) United States Patent
Breslow et al.

(10) Patent No.: US 9,777,904 B2
(45) Date of Patent: Oct. 3, 2017

(54) LED LIGHTING ASSEMBLY AND METHOD OF LIGHTING FOR A MERCHANDISE DISPLAY

(71) Applicant: RTC Industries, Inc., Rolling Meadows, IL (US)

(72) Inventors: David S. Breslow, Chicago, IL (US); John Swafford, Palatine, IL (US)

(73) Assignee: RTC Industries, Inc., Rolling Meadows, IL (US)

( * ) Notice: Subject to any disclaimer, the term of this patent is extended or adjusted under 35 U.S.C. 154(b) by 0 days.

(21) Appl. No.: 14/965,514

(22) Filed: Dec. 10, 2015

(65) Prior Publication Data
US 2016/0091168 A1    Mar. 31, 2016

Related U.S. Application Data

(63) Continuation of application No. 13/790,983, filed on Mar. 8, 2013, now Pat. No. 9,222,645, which is a (Continued)

(51) Int. Cl.
*A47F 11/10*    (2006.01)
*F21V 7/00*    (2006.01)
(Continued)

(52) U.S. Cl.
CPC ............... *F21V 7/00* (2013.01); *A47F 3/001* (2013.01); *A47F 11/10* (2013.01); *F21K 9/60* (2016.08);
(Continued)

(58) Field of Classification Search
CPC ... F21V 5/04; F21V 5/007; F21K 9/50; F21Y 2103/003; F21W 2131/405
See application file for complete search history.

(56) References Cited

U.S. PATENT DOCUMENTS

| 1,820,086 A | 8/1931 | Naylor |
| 3,777,410 A | 12/1973 | Robinson |

(Continued)

FOREIGN PATENT DOCUMENTS

| CN | 102216677 A | 10/2011 |
| EP | 0632511 A2 | 1/1995 |

(Continued)

OTHER PUBLICATIONS

Dec. 18, 2015—(AU) Examination Report—App 2013229909.
(Continued)

*Primary Examiner* — Julie Bannan
(74) *Attorney, Agent, or Firm* — Banner & Witcoff, Ltd.

(57) ABSTRACT

Aspects of the disclosure relate to a lighting assembly and method for illuminating a vertical planar area, such as a merchandise display. The lighting assembly can comprise two opposing support arms and a lighting bar extending between the two opposing support arms, a circuit board having a plurality of LEDs mounted to the inside of the lighting bar; and a plurality of reflective surfaces located adjacent to the plurality of LEDs, wherein the plurality of reflective surfaces are positioned such that the LEDs project a first light beam in a first direction and a second light beam in a second direction different than the first direction.

16 Claims, 10 Drawing Sheets

Related U.S. Application Data continuation-in-part of application No. 13/162,076, filed on Jun. 16, 2011, which is a continuation-in-part of application No. 12/955,198, filed on Nov. 29, 2010, now Pat. No. 8,864,334.

(60) Provisional application No. 61/608,371, filed on Mar. 8, 2012.

(51) Int. Cl.

| | | |
|---|---|---|
| *H05K 3/30* | (2006.01) | |
| *A47F 3/00* | (2006.01) | |
| *F21V 5/04* | (2006.01) | |
| *F21V 17/06* | (2006.01) | |
| *F21V 21/30* | (2006.01) | |
| *F21S 4/28* | (2016.01) | |
| *F21K 9/90* | (2016.01) | |
| *F21K 9/60* | (2016.01) | |
| *F21V 7/05* | (2006.01) | |
| *F21V 5/00* | (2015.01) | |
| *F21V 17/16* | (2006.01) | |
| *F21W 131/405* | (2006.01) | |
| *F21Y 103/10* | (2016.01) | |
| *F21Y 115/10* | (2016.01) | |

(52) U.S. Cl.
CPC ........ *F21K 9/90* (2013.01); *F21S 4/28* (2016.01); *F21V 5/04* (2013.01); *F21V 17/06* (2013.01); *F21V 17/16* (2013.01); *F21V 21/30* (2013.01); *H05K 3/30* (2013.01); *A47B 2220/0075* (2013.01); *F21V 5/00* (2013.01); *F21V 7/05* (2013.01); *F21V 17/164* (2013.01); *F21W 2131/405* (2013.01); *F21Y 2103/10* (2016.08); *F21Y 2115/10* (2016.08); *Y10T 29/4913* (2015.01)

(56) References Cited

U.S. PATENT DOCUMENTS

| | | | |
|---|---|---|---|
| 3,882,490 | A | 5/1975 | Tashiro et al. |
| 3,934,105 | A | 1/1976 | Lockard |
| 3,949,504 | A | 4/1976 | Willis et al. |
| 4,164,009 | A | 8/1979 | Maguire, Jr. et al. |
| 4,228,596 | A | 10/1980 | Daniel |
| 4,254,453 | A | 3/1981 | Mouyard et al. |
| 4,306,716 | A | 12/1981 | James et al. |
| 4,365,120 | A | 12/1982 | Pounds |
| 4,603,496 | A | 8/1986 | Latz et al. |
| 4,733,335 | A | 3/1988 | Serizawa et al. |
| 4,838,557 | A | 6/1989 | Floyhar |
| 4,843,527 | A | 6/1989 | Britt |
| 4,914,731 | A | 4/1990 | Chen |
| 4,953,066 | A | 8/1990 | Schiffer |
| 4,959,761 | A | 9/1990 | Critelli et al. |
| 5,031,083 | A | 7/1991 | Claesson |
| 5,032,960 | A | 7/1991 | Katoh |
| 5,043,716 | A | 8/1991 | Latz et al. |
| 5,226,723 | A | 7/1993 | Chen |
| 5,321,417 | A | 6/1994 | Voetzke et al. |
| 5,403,102 | A | 4/1995 | Yokoyama |
| 5,404,282 | A | 4/1995 | Klinke et al. |
| 5,410,328 | A | 4/1995 | Yoksza et al. |
| 5,475,241 | A | 12/1995 | Harrah et al. |
| 5,519,596 | A | 5/1996 | Woolverton |
| 5,564,819 | A | 10/1996 | Yamaguchi |
| 5,685,634 | A | 11/1997 | Mulligan |
| 5,712,650 | A | 1/1998 | Barlow |
| 5,882,105 | A | 3/1999 | Barlow |
| 5,949,581 | A | 9/1999 | Kurtenbach et al. |
| 6,106,137 | A | 8/2000 | Adams et al. |
| 6,188,527 | B1 | 2/2001 | Bohn |
| 6,283,612 | B1 | 9/2001 | Hunter |
| 6,404,131 | B1 | 6/2002 | Kawano et al. |
| D464,162 | S | 10/2002 | Segretto |
| 6,502,956 | B1 | 1/2003 | Wu |
| 6,536,924 | B2 | 3/2003 | Segretto |
| 6,558,017 | B1 | 5/2003 | Saraiji et al. |
| 6,561,690 | B2 | 5/2003 | Balestriero et al. |
| 6,736,525 | B2 | 5/2004 | Chin |
| 6,773,139 | B2 | 8/2004 | Sommers |
| D496,122 | S | 9/2004 | Kan |
| D506,274 | S | 6/2005 | Moriyama et al. |
| 6,995,355 | B2 | 2/2006 | Rains, Jr. et al. |
| 6,995,405 | B2 | 2/2006 | Braddell et al. |
| 6,997,576 | B1 | 2/2006 | Lodhie et al. |
| 7,033,060 | B2 | 4/2006 | Dubuc |
| D546,985 | S | 7/2007 | Hoshikawa et al. |
| D550,379 | S | 9/2007 | Hoshikawa et al. |
| D550,869 | S | 9/2007 | Hoshikawa et al. |
| D565,515 | S | 4/2008 | Chen |
| D568,500 | S | 5/2008 | Uemoto et al. |
| D571,938 | S | 6/2008 | Uemoto et al. |
| D578,681 | S | 10/2008 | Huang |
| D579,138 | S | 10/2008 | Ghini |
| 7,441,922 | B2 | 10/2008 | Huang et al. |
| D581,569 | S | 11/2008 | Levine |
| D595,444 | S | 6/2009 | Shimomura |
| D603,079 | S | 10/2009 | Toot et al. |
| D606,673 | S | 12/2009 | Kao |
| 7,633,684 | B1 | 12/2009 | Lo |
| 7,648,251 | B2 | 1/2010 | Whitehouse et al. |
| 7,674,010 | B2 | 3/2010 | Griffiths et al. |
| D614,323 | S | 4/2010 | Stewart et al. |
| D615,223 | S | 5/2010 | Huang |
| 7,722,221 | B2 | 5/2010 | Chae |
| 7,726,831 | B2* | 6/2010 | Shibusawa ............... A47F 3/001 362/125 |
| 7,810,951 | B1 | 10/2010 | Lee et al. |
| 7,824,055 | B2* | 11/2010 | Sherman ............... A47F 5/0043 362/125 |
| 7,824,057 | B2* | 11/2010 | Shibusawa ............... A47F 3/001 362/125 |
| 7,857,482 | B2 | 12/2010 | Reo et al. |
| 7,896,521 | B2 | 3/2011 | Becker et al. |
| 8,066,406 | B2 | 11/2011 | Boyer et al. |
| 8,070,329 | B1 | 12/2011 | Bechtel et al. |
| 8,215,795 | B2 | 7/2012 | Pichel |
| 2002/0044456 | A1 | 4/2002 | Balestriero et al. |
| 2004/0174706 | A1 | 9/2004 | Kan |
| 2005/0265019 | A1 | 12/2005 | Sommers et al. |
| 2006/0146531 | A1* | 7/2006 | Reo ........................ F21V 5/008 362/244 |
| 2006/0164833 | A1 | 7/2006 | Parkyn et al. |
| 2007/0291480 | A1 | 12/2007 | Sherman |
| 2008/0062691 | A1 | 3/2008 | Villard et al. |
| 2008/0084693 | A1 | 4/2008 | Shimada et al. |
| 2008/0094824 | A1 | 4/2008 | Stack et al. |
| 2008/0094837 | A1 | 4/2008 | Dobbins et al. |
| 2008/0158858 | A1 | 7/2008 | Madireddi et al. |
| 2008/0298058 | A1 | 12/2008 | Kan et al. |
| 2008/0304252 | A1 | 12/2008 | Shibusawa et al. |
| 2009/0002990 | A1 | 1/2009 | Becker et al. |
| 2009/0103299 | A1 | 4/2009 | Boyer et al. |
| 2009/0103307 | A1 | 4/2009 | Shu |
| 2009/0207602 | A1 | 8/2009 | Reed et al. |
| 2009/0219720 | A1 | 9/2009 | Reed |
| 2009/0225543 | A1 | 9/2009 | Jacobson et al. |
| 2009/0323330 | A1 | 12/2009 | Gordin et al. |
| 2009/0323334 | A1 | 12/2009 | Roberts et al. |
| 2010/0014288 | A1 | 1/2010 | Kreutzer et al. |
| 2010/0097780 | A1 | 4/2010 | Beatenbough et al. |
| 2010/0110660 | A1 | 5/2010 | Brukilacchio |
| 2010/0165618 | A1* | 7/2010 | Vissenberg et al. ...... F21K 9/00 362/231 |
| 2010/0195317 | A1 | 8/2010 | Oketani et al. |
| 2010/0254138 | A1 | 10/2010 | Chen et al. |
| 2010/0296297 | A1 | 11/2010 | Ong et al. |
| 2011/0063844 | A1 | 3/2011 | Swafford, Jr. et al. |
| 2011/0063857 | A1* | 3/2011 | Li ........................... F21V 5/007 362/336 |
| 2011/0096533 | A1 | 4/2011 | Sekela et al. |

(56) References Cited

U.S. PATENT DOCUMENTS

| | | | |
|---|---|---|---|
| 2011/0141728 A1* | 6/2011 | Russello | F21V 3/00 362/235 |
| 2011/0149548 A1 | 6/2011 | Yang et al. | |
| 2011/0199767 A1 | 8/2011 | Marquardt et al. | |
| 2011/0310598 A1 | 12/2011 | Swafford, Jr. | |
| 2012/0074432 A1* | 3/2012 | Chou | H01L 25/167 257/88 |

FOREIGN PATENT DOCUMENTS

| | | |
|---|---|---|
| GB | 2468036 A | 8/2010 |
| JP | S60-230626 A | 11/1985 |
| JP | S62-248271 A | 10/1987 |
| JP | S64-069060 A | 3/1989 |
| JP | H1-165182 A | 6/1989 |
| JP | H1-311501 A | 12/1989 |
| JP | H02-067769 A | 3/1990 |
| JP | H4-889913 | 7/1992 |
| JP | H5-291626 A | 11/1993 |
| JP | H6-231604 A | 8/1994 |
| TW | M364168 U | 7/1999 |
| WO | 2008100894 A1 | 8/2008 |
| WO | 2011019753 A1 | 2/2011 |

OTHER PUBLICATIONS

May 23, 2012—(WO) ISR and Written Opinion—PCT/US11/61323.

Oct. 10, 2011—(WO) ISR and Written Opinion—App. No. PCT/US11/40852.

Apr. 3, 2014—(AU) Examination Report—App. No. 2011268166.

May 14, 2013—(WO) ISR and Written Opinion—App. No. PCT/US13/29888.

Dec. 18, 2015—(AU) Examination Report—App. No. 2013229909.

Jan. 29, 2016—(EP) Examination Report—App. No. 13711802.2.

Jul. 14, 2008—(CN) ISR—App. No. 201380021559.6.

* cited by examiner

LED LIGHTING ASSEMBLY AND METHOD OF LIGHTING FOR A MERCHANDISE DISPLAY

CROSS REFERENCE TO RELATED APPLICATIONS

This Application is a continuation of U.S. application Ser. No. 13/790,983, filed Mar. 8, 2013, which is a continuation-in-part of U.S. application Ser. No. 13/162,076, filed Jun. 16, 2011, which is a continuation-in-part of U.S. application Ser. No. 12/955,198, filed Nov. 29, 2010, now U.S. Pat. No. 8,864,334 issued Oct. 21, 2014. This application also claims priority to U.S. Provisional Application No. 61/608,374, filed Mar. 8, 2012.

FIELD OF INVENTION

This invention relates generally to LED lighting assemblies for a merchandise display and methods of lighting. In particular, in one aspect of the invention, an LED light assembly is provided with a plurality of reflective surfaces located adjacent to the LEDs, wherein the reflective surfaces are positioned such that the LED projects a first light beam in a first direction and the reflective surface directs a second light beam in a second direction different than the first direction.

BACKGROUND

In many retail stores it is desired to illuminate the front of product packages on merchandise display shelves to improve the product presentation, shopping environment, and to highlight products to ultimately improve the overall sales of the products.

Typically, this is accomplished with a fluorescent lighting fixture, which is located above a shelving unit and emits light down upon the front of the shelves. However, in most existing installations of this type, much of the light is not used because it is not captured and directed to the front of the shelves. Lack of focusing, specific reflectors, or beam modification results in product on higher shelves being too brightly illuminated and product on lower shelves receiving very little light at all.

Additionally, there are also significant costs with replacing lamps on fluorescent fixtures when they deteriorate or burn out including the costs of new lamps and labor to replace the lamps. In addition, when the lamps are replaced on the scale of a large retail chain, replacement can become environmentally harmful since all fluorescent lamps contain mercury.

In one exemplary aspect of the present invention, more of the available light is directed to the front of products merchandised on a shelf and a higher illuminance per watt of power is output than with existing fluorescent fixtures. In another exemplary aspect of the present invention, a lower cost lighting solution is disclosed that uses less energy, directs and improves the illumination on the product packages, particularly on the lower shelves, and requires lower maintenance costs.

SUMMARY

The following presents a general summary of aspects of the invention in order to provide a basic understanding of the invention and various features of it. This summary is not intended to limit the scope of the invention in any way, but it simply provides a general overview and context for the more detailed description that follows.

In one exemplary embodiment, a lighting assembly for a merchandise display is disclosed. The lighting assembly can comprise: (a) two opposing support arms and a lighting bar extending between the two opposing support arms, (b) a circuit board assembly having a plurality of LEDs mounted to the inside of the lighting bar, wherein the plurality of LEDs project a light in a beam pattern on a merchandise display; and (c) a plurality of reflective surfaces located adjacent to the LEDs, wherein the reflective surfaces are positioned such that the LED projects a first light beam in a first direction and the reflective surface directs a second light beam in a second direction different than the first direction. The lighting assembly may also include lenses placed over a corresponding one or more of the plurality of LEDs, and wherein the lenses capture the light from a respective LED, modify the beam pattern, and re-project the light.

In another exemplary embodiment, a lighting method for a merchandise display is disclosed. The method can comprise: (a) arranging a plurality of LEDs on a circuit board located within a lighting bar, wherein the plurality of LEDs project a light in a beam pattern on a merchandise display; (b) securing a plurality of reflective surfaces adjacent to the LEDs, wherein the reflective surfaces are positioned such that the LED projects a first light beam in a first direction and the reflective surface directs a second light beam in a second direction different than the first direction. The lighting method may also include (c) securing a plurality of lenses to the circuit board; and (d) placing the plurality of lenses over one or more of the LEDS on the lighting bar so as to capture the light from a respective LED, modify a beam pattern emitted from the respective LED, and re-project the light emitted from the respective LED.

Other objects and features of the invention will become apparent by reference to the following description and drawings.

BRIEF DESCRIPTION OF THE DRAWINGS

A more complete understanding of the present invention and certain advantages thereof may be acquired by referring to the following detailed description in consideration with the accompanying drawings, in which.

The reader is advised that the attached drawings are not necessarily drawn to scale.

DETAILED DESCRIPTION

In the following description of various example structures in accordance with the invention, reference is made to the accompanying drawings, which form a part hereof, and in which are shown by way of illustration of various structures in accordance with the invention. Additionally, it is to be understood that other specific arrangements of parts and structures may be utilized, and structural and functional modifications may be made without departing from the scope of the present invention. Also, while the terms "top" and "bottom" and the like may be used in this specification to describe various example features and elements of the invention, these terms are used herein as a matter of convenience, e.g., based on the example orientations shown in the Figures and/or the orientations in typical use. Nothing in this specification should be construed as requiring a specific three dimensional or spatial orientation of structures in order to fall within the scope of this invention.

Figure 1:
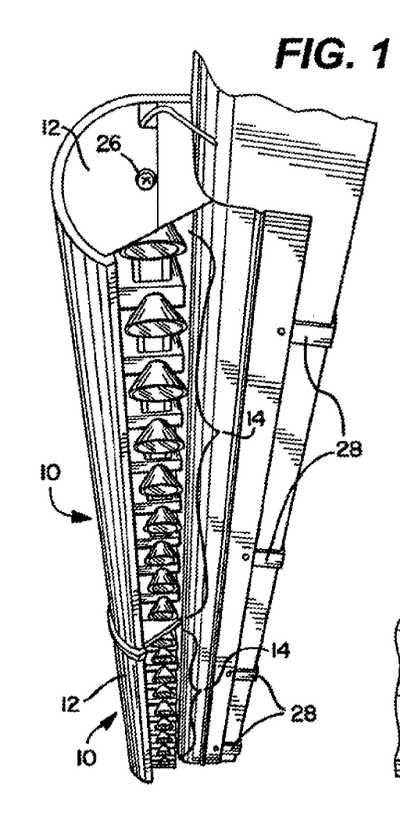
FIG. 1 shows a perspective view of exemplary lighting assemblies in use on a merchandise display.
Figure 2:
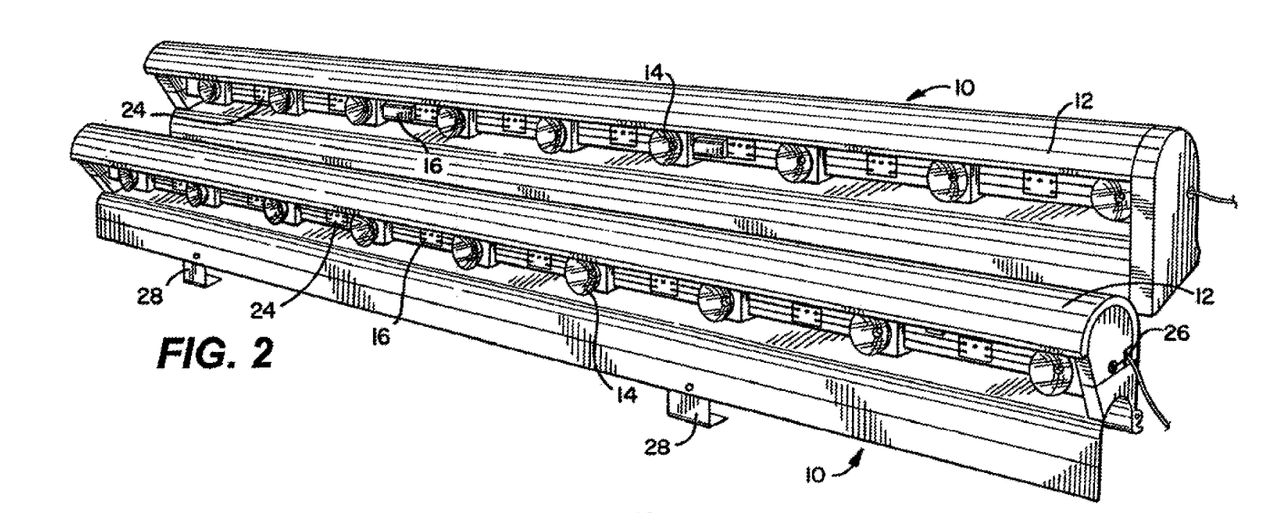
FIG. 2 shows another perspective view of exemplary lighting assemblies.
Figure 3B:
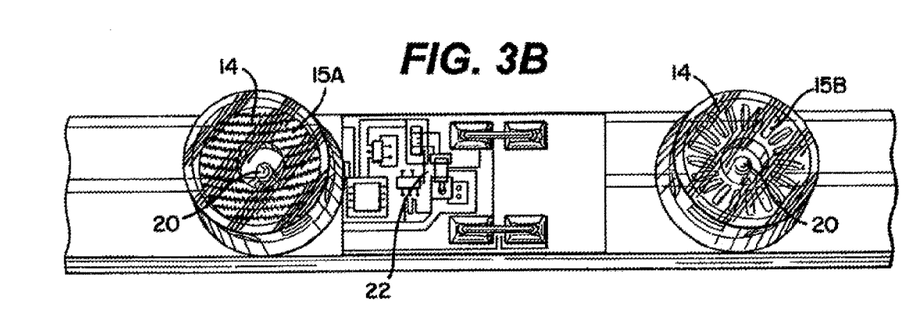
Figure 4:
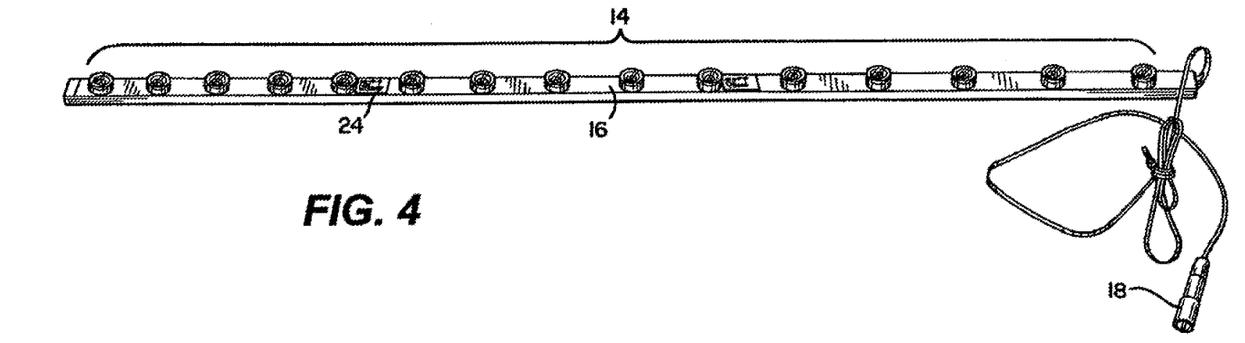
FIG. 4 shows a perspective view of the exemplary circuit board assembly.

FIGS. 1 and 2 depict exemplary LED lighting assemblies 10 for a merchandise display. As shown in FIGS. 1 and 2, the LED lighting assemblies 10 each include a housing 12, a circuit board assembly 24, and a circuit board 16 having an LED driver circuit 22 (shown in FIG. 3B). The housing 12 can include a series of clamps 28 for securing the housings above the area being illuminated. A plurality of LED emitters 20 are mounted to the circuit board 16 and are powered with the LED driver circuit 22. As shown in FIG. 4, the LEDs are spaced apart from each other along the circuit board assembly 24. The circuit board assembly 24 is also connected to a power cord 18.

Figure 3A:
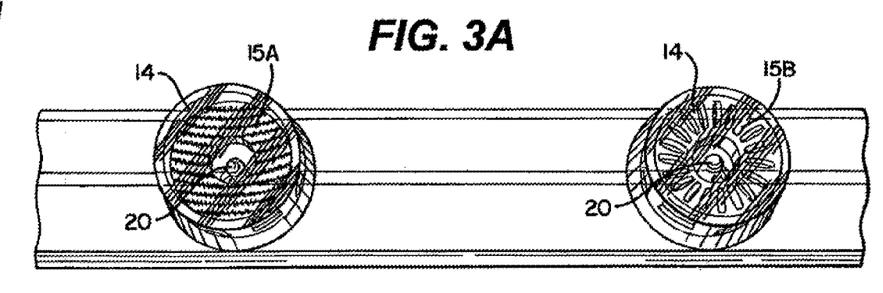
FIGS. 3A and 3B show top views of an exemplary circuit board assembly contained in the lighting assemblies.

The lenses 14 can be secured over individual LED emitters 20 to provide different refractive properties for reflecting the light emitted by the LEDs in various angles and directions such as over product shelves. As shown in FIGS. 3A and 3B, the lenses 14 can be provided with different refractive configurations. However, alternatively, the lenses can all be provided with the same refractive configurations. In another alternative embodiment, the lenses may be placed over every other LED to modify the light pattern. Other arrangements are also contemplated to provide optimal lighting properties and configurations depending on the environment and desired results.

In one exemplary embodiment, as shown in FIGS. 3A and 3B, the lenses are provided with a spotlight beam refractive surface 15A and an oval beam refractive surface 15B. The light emitted from the spotlight pattern 15A lenses on the circuit board assembly 14 is directed at the lowest point such as a product on the bottom shelf, whereas the light emitted from the oval pattern 15B lenses is directed at the upper and middle areas such as at products on the top and middle shelves. When in use in the lighting assembly, the different refractive surfaces or lens types (spotlight pattern 15A and oval pattern 15B) project the light in various directions such that the individual patterns in aggregate from all LED emitters, result in light more evenly distributed in a vertical plane such as over products and shelves on display.

In one exemplary embodiment, the lens types can alternate on the circuit board assembly 24 between the spotlight pattern 15A configuration and the oval pattern 15B configuration. This embodiment may aid in providing an evenly distributed vertical lighting area such as over product shelves. In particular, the lighting pattern is narrower near the housing such as near the top shelves and grows wider as it travels down to the lower areas such as near the bottom shelves. Additionally, the light from the oval pattern 15B lenses overlaps to provide for more evenly lit areas.

The lenses 14 may be secured to the circuit board assembly 24 via a snap fit or by any other known suitable connection. The lenses may be fixed individually, for example, one lens per one LED or one or more lenses may be connected together to create a uniform, one-piece lens assembly that is easier, faster, and more cost effective to install on the circuit board assembly.

The LED lighting housing can be adjustable in several ways to adjust the orientation of the housing and to fine tune the position of the projected light. First, the housing can be adjusted on horizontal arms (not shown) that are generally perpendicular to the long edge of the shelves and positioned above the top shelf in a set of shelves. This adjustment allows the LED lighting assembly to be moved closer to or farther from the plane being illuminated. The second adjustment allows the assembly to rotate about its horizontal axis 26 to direct light at a different angle in the plane. The two adjustments change the angle at which the light intercepts the product faces. Moving the lighting fixture away from the product on the horizontal arms can improve the lighting on the lower positioned product by reducing shadows on the product caused by the lower shelves.

Each of the LED lighting assemblies 10 modify the light output from the point source LED emitters 20 to illuminate an artificial planar surface area which can be represented by a front surface of product on a shelf in a retail store. Each LED lighting assembly can be approximately the length of a shelf in a retail store, typically 3 ft or 4 ft long, or even as short as 6 inches or as long as 20 feet. The LED lighting assemblies 10 can be positioned in a horizontal orientation above a product on the top shelf and slightly in front of an artificial plane. The LED lighting assembly 10 may also be positioned in any other location with respect to the product, not necessarily only in alignment with the shelf. The light is modified by the plurality of lenses 14 fitted onto the circuit board 16 and over the LEDs 20 to capture the light from an LED, modify the beam pattern, and re-project the light evenly over a vertical plane in front of the product shelves.

Figure 5:
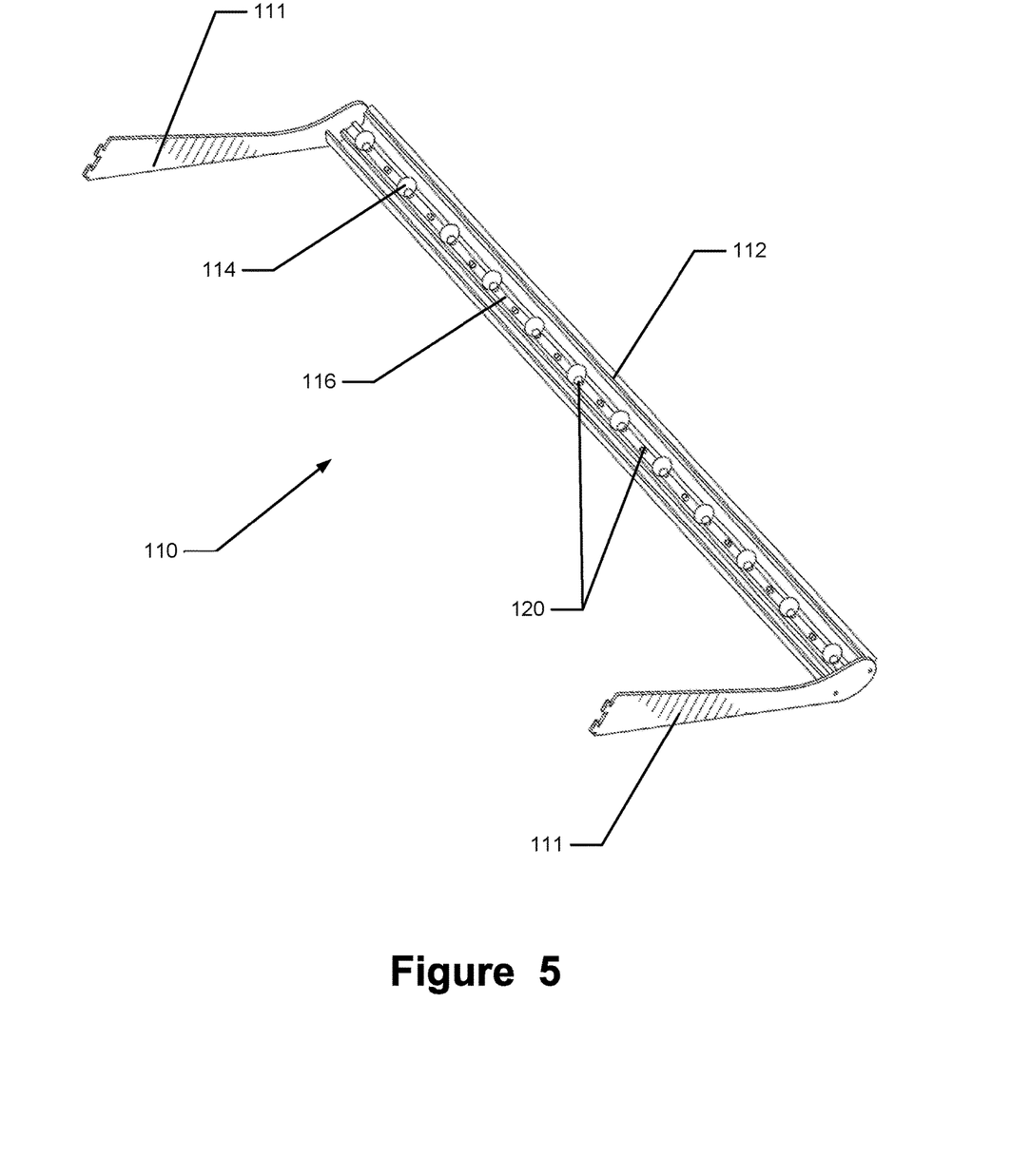
FIG. 5 shows a bottom perspective view of another exemplary lighting assembly.
Figure 6:
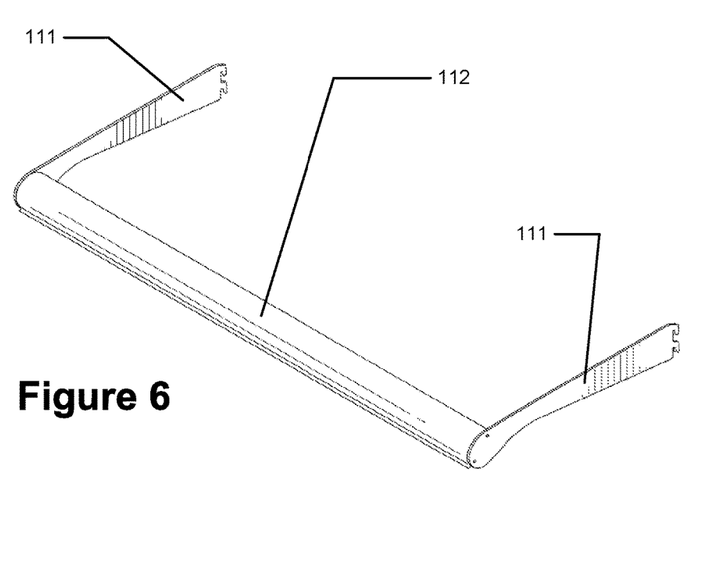
FIG. 6 shows a top perspective view of the exemplary lighting assembly shown in FIG. 5.
Figure 7:
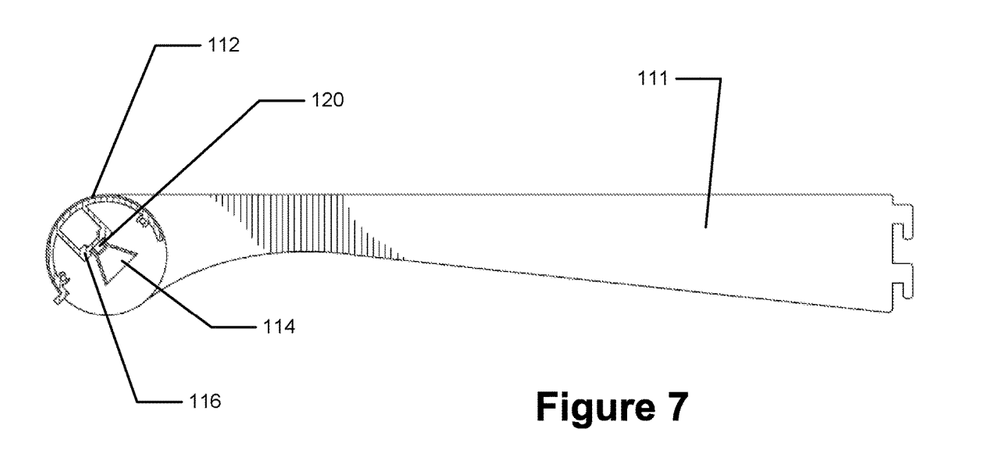
FIG. 7 shows a cross-section view of the exemplary lighting assembly from FIG. 5.

In another exemplary embodiment, as illustrated in FIGS. 5 through 7, another lighting assembly 110 is depicted. The lighting assembly 110 (or illumination device) may include two opposing support arms 111 and a lighting bar 112 extending between the two support arms 111. The two support arms 111 may be mountable into the support posts of a gondola type merchandise display shelf. Typically, the support arms 111 and the lighting bar 112 are positioned above the top shelf of the merchandise display system. The support arms 111 and the lighting bar 112, however, can be located at any desired position on the merchandise display system.

The lighting bar 112 may define a C-shaped configuration in cross-section. The lighting bar 112 may define other shapes and other sized configuration in cross-section without departing from this disclosure. The lighting bar 112 may act as a housing to a plurality of light emitting diodes (LED) 120 and may be configured to mount these LEDs 120 on the inside of the C-shaped cross section, as illustrated in FIGS. 5 and 7. The lighting bar 112 may be made of metal or any other suitable material. The LEDs 120 may be spaced along the lighting bar 112 on the inside of the lighting bar 112 as shown in FIGS. 5 and 7. The LEDs 120 may be electrically coupled together by a circuit board 116 positioned on the lighting bar 112. The circuit board 116 may also incorporate the appropriate resistors to control the power supplied to each LED 120.

The LEDs 120 may provide any desired color, which may be controlled by the semiconductor material of the LED light 120. As illustrated in FIGS. 5 and 7, a reflector or lens 114 may be positioned around every other LED 120 on the lighting bar 112. The reflectors or lens 114 may also be placed intermittently around LEDs 120 on the lighting bar 112. The reflector or lens 114 may also be positioned in irregular patters around LEDs 120 on the lighting bar 112. The reflector or lens 114 serves the purpose of directing the emitted light in a desired direction and angle. The reflector or lens 114 may be positioned and oriented at any of the numerous possible angles to direct light in the desired direction. With the use of the alternating arrangement of LEDs 120 with reflectors 114 and without reflectors 114, it has been determined that the light emitted from the lighting bar 112 covers the entire merchandise display system, from the top shelf to the bottom shelf. As a result, all shelves of the merchandise display system are properly illuminated which makes the products on those shelves more visible and attractive to consumers. Additionally, the lens systems 14 as described in the first embodiment and illustrated in FIGS. 1 through 4 may be utilized with this lighting assembly.

It should be understood that other lighting configurations are possible with the lighting bar 112 to adequately direct light to the entire merchandise display system. For example, it is possible to position reflectors over every third or fourth LED 120, and so on. Also, it is possible for the lighting bar 112 to define other numerous shapes and configurations, depending on the type of shelf and merchandise display system on which the lighting bar 112 is used.

In another exemplary embodiment, as illustrated in FIGS. 8 through 12, another lighting assembly 210 is depicted. The lighting assembly 210 (or illumination device) may include two opposing support arms 211 and a lighting bar 212 extending between the two support arms 211. The two support arms 211 may be mountable into the support posts of a gondola type merchandise display shelf or any other similar display shelf. Typically, the support arms 211 and the lighting bar 212 are positioned above the top shelf of the merchandise display system. The support arms 211 and the lighting bar 212, however, can be located at any desired position on the merchandise display system.

Generally, the lighting bar 212 may define a C-shaped configuration in cross-section. The lighting bar 212 may act as a housing to a plurality of light emitting diodes (LED) 220 and may be configured to mount these LEDs 220 on the inside of the C-shaped cross section, as illustrated in FIGS. 5 and 7. The lighting bar 212 may be made of metal or any other suitable material. The LEDs 220 may be spaced along the lighting bar 212 on the inside of the lighting bar 212 as shown in FIGS. 5 and 7. The LEDs 220 may be electrically coupled together by a circuit board 216 positioned on the lighting bar 212.

Figure 9A:
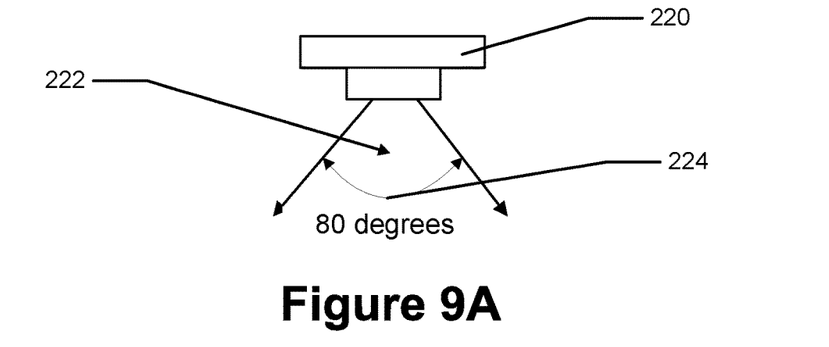
FIGS. 9A through 9C show various beam angles for exemplary LEDs used in accordance with this disclosure.
Figure 9B:
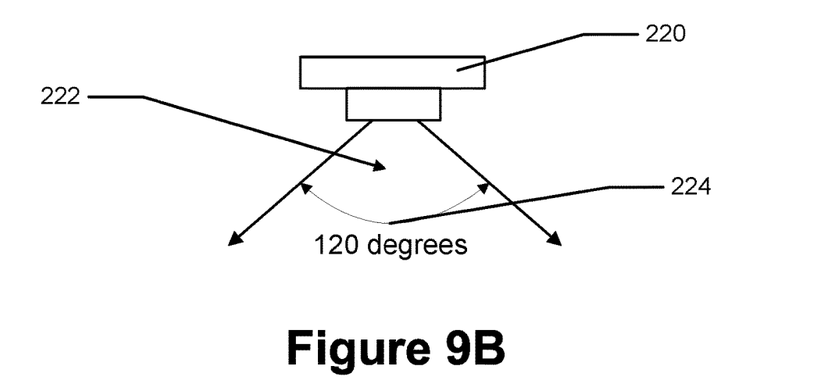
Figure 9C:
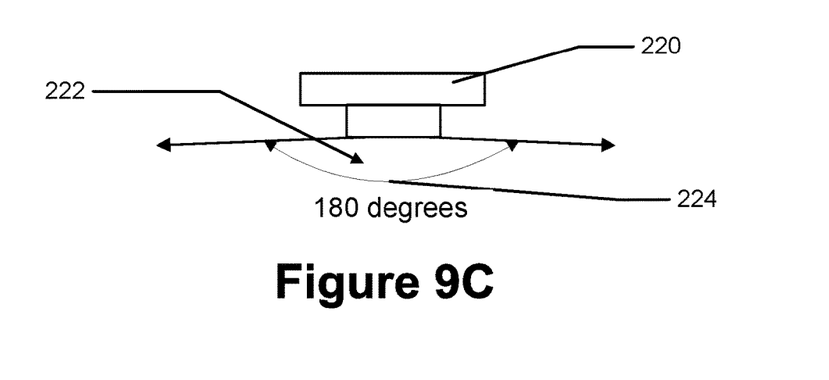

Generally, LEDs 220 output a directional beam 222. The LED 220 may also include a given beam angle 224 that is output from the LED 220. As illustrated in FIGS. 9A-9C, LEDs 220 may have beam angles 224 of approximately 80 degrees, 120 degrees, or 180 degrees. LEDs with other beam angles 224 may be utilized or incorporated with the lighting system. FIG. 9A illustrates a beam angle 224 of approximately 80 degrees. FIG. 9B illustrates a beam angle 224 of approximately 120 degrees. FIG. 9C illustrates a beam angle 224 of approximately 180 degrees.

Figure 10A:
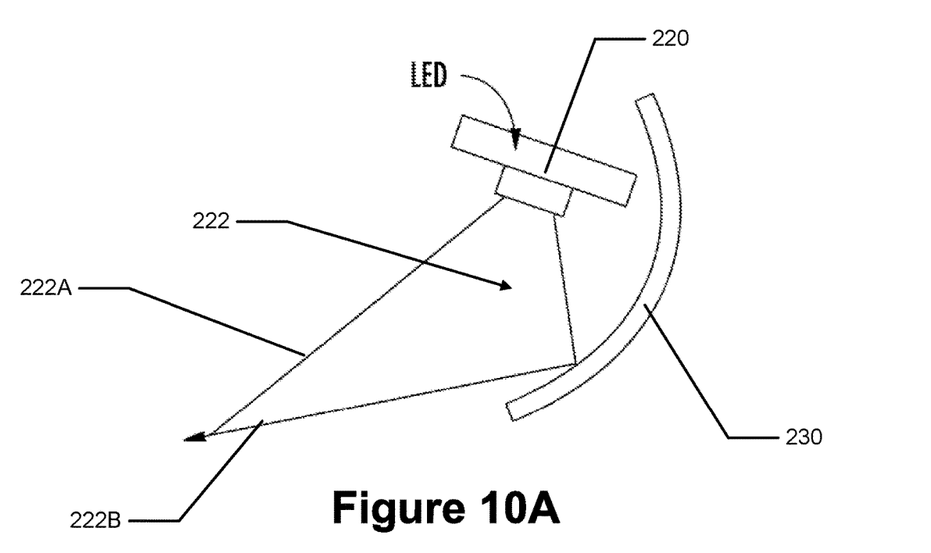
FIGS. 10A and 10B show cross-section views of embodiments of the exemplary lighting assembly from FIG. 8.
Figure 10B:
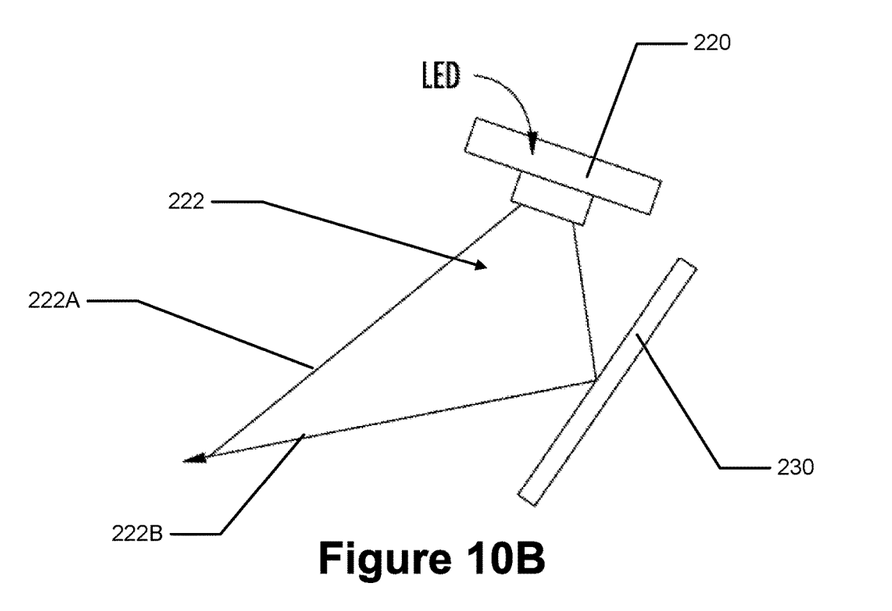

A reflective surface 230 may be positioned near or adjacent the output of one or more of the LEDs 220. The reflective surface 230 may allow better control of a portion of the beam. The reflective surface 230 may also allow the deflection/reflection of a portion of the beam 222. Additionally, as will be explained in detail below, the reflective surface 230 may also allow the splitting or dividing of the beam 222 to thereby create multiple beams 222 projecting from the LED. As illustrated in FIGS. 10A and 10B, the reflective surface is positioned adjacent to the LED 220 and the projected beam 222 of the LED 220. As illustrated in FIGS. 10A and 10B, the reflective surface may direct a portion of the projected beam 222 from the LED 220 in a different direction, thereby creating two different beams of light 222A and 222B.

Figure 11A:
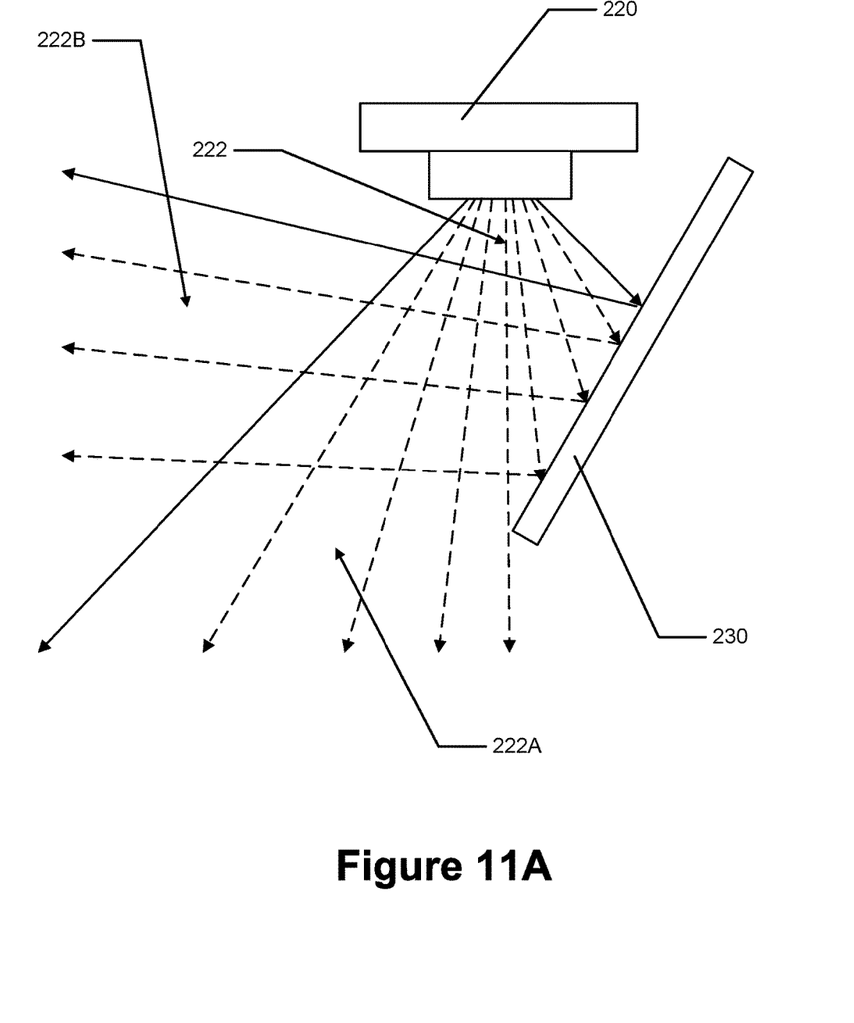
FIGS. 11A and 11B show cross-section views of other embodiments of the exemplary lighting assembly from FIG. 8.
Figure 12:
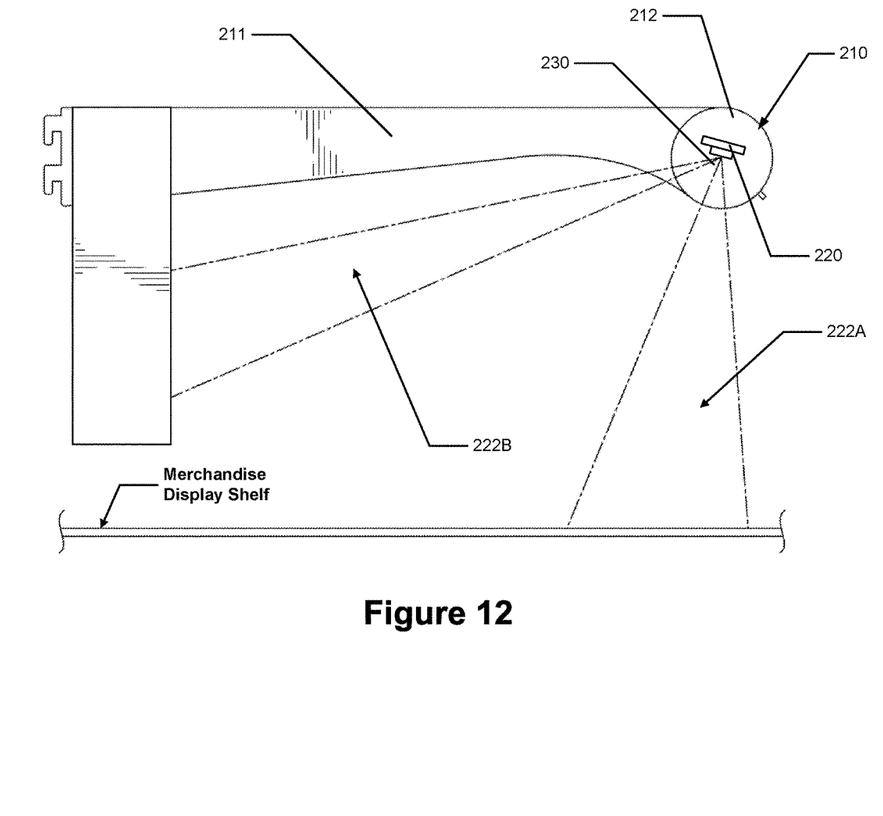
FIG. 12 shows a cross-section view of another embodiment of the exemplary lighting assembly from FIG. 8.

In one embodiment, the reflective surface 230 may be positioned parallel to the path of the beam 222, but only covering and/or reflecting a portion of the beam 222. For example, as shown in FIG. 11A, the reflective surface 230 is positioned parallel to the path of the beam 222, but only covering and/or reflecting approximately half of the beam 222. The reflective surface 230 thereby allows approximately 50% of the beam 222 to project in the direction that the LED 220 is directionally pointing (downward in this illustration), while reflecting the other 50% of the beam 222 in a direction based on the position and angle of the reflective surface 230 (horizontal in this illustration). This use of the reflective surface 230 with one LED 220 thereby can create two different LED beams 222 using just one LED 220. FIG. 10A illustrates a first beam 222A projecting in a downward or vertical direction, wherein the first beam 222A is not reflected from the reflective surface 230. FIG. 10A also illustrates a second beam 222B projecting in a linear or horizontal direction, wherein the second beam 222B is reflected by the reflective surface 230. Furthermore, as illustrated in FIG. 12, the LED 220 with the reflective surface 230 may create a first beam 222A that projects as a down light and a second beam 222B that projects as a back light against product shelving.

Figure 11B:
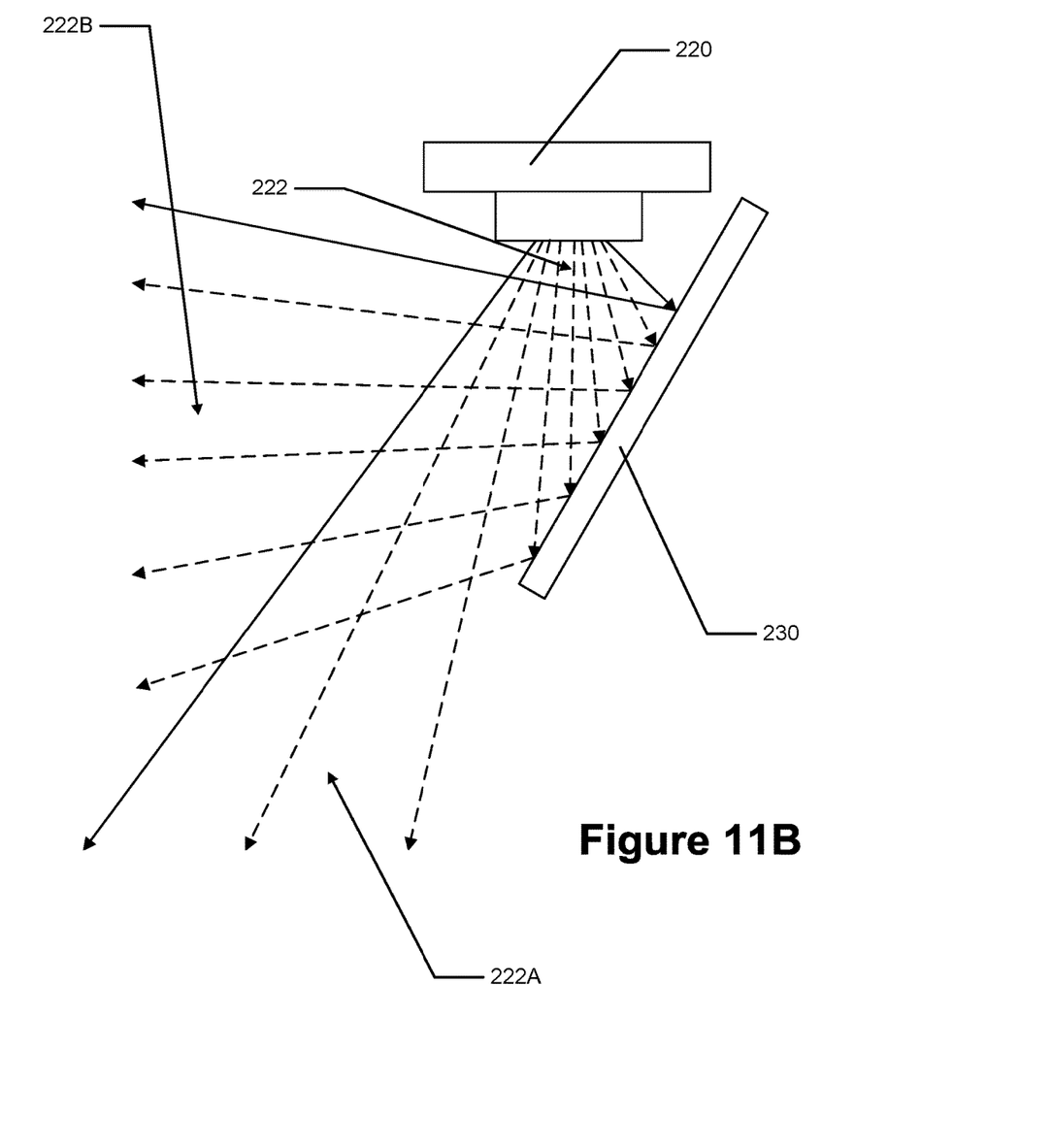

Without departing from this disclosure, the amount that the reflective surface reflects can be varied. In one exemplary embodiment, as illustrated in FIG. 11B, the reflective surface may allow approximately 30% of the beam to project in the direction that the LED is directionally pointing (downward in this illustration), while reflecting the other 70% of the beam in a direction based on the position and angle of the reflective surface (horizontal in this illustration). In another exemplary embodiment, the reflective surface may allow approximately 70% of the beam to project in the direction that the LED is directionally pointing, while reflecting the other 30% of the beam in a direction based on the position and angle of the reflective surface. The reflective surface may allow a minimal percent (just more than 0%) of the beam to 99% of the beam to project in the direction that the LED is directionally pointing, while reflecting the remaining portion of the beam.

Generally, the reflective surface 230 may be a mirror. The reflective surface 230 may be other surfaces without departing from this invention, such as white/shiny, textured, or an optical film with surface coatings. Other reflective surfaces 230 not contemplated at this time may also be utilized without departing from this disclosure. The reflective surface 230 may be a flat reflective surface, or a flat mirror. In another embodiment without departing from this disclosure, the reflective surface 230 may be a curved reflective surface, or a curved mirror. Other surface geometry may be utilized for the reflective surface 230 without departing from this disclosure. FIG. 10A illustrates a curved reflective surface 232. FIG. 10B illustrates a flat reflective surface 234. Additionally, the reflective surface 230 may be an intermittent mirror or a continuous mirror without departing from this disclosure.

Figure 8:
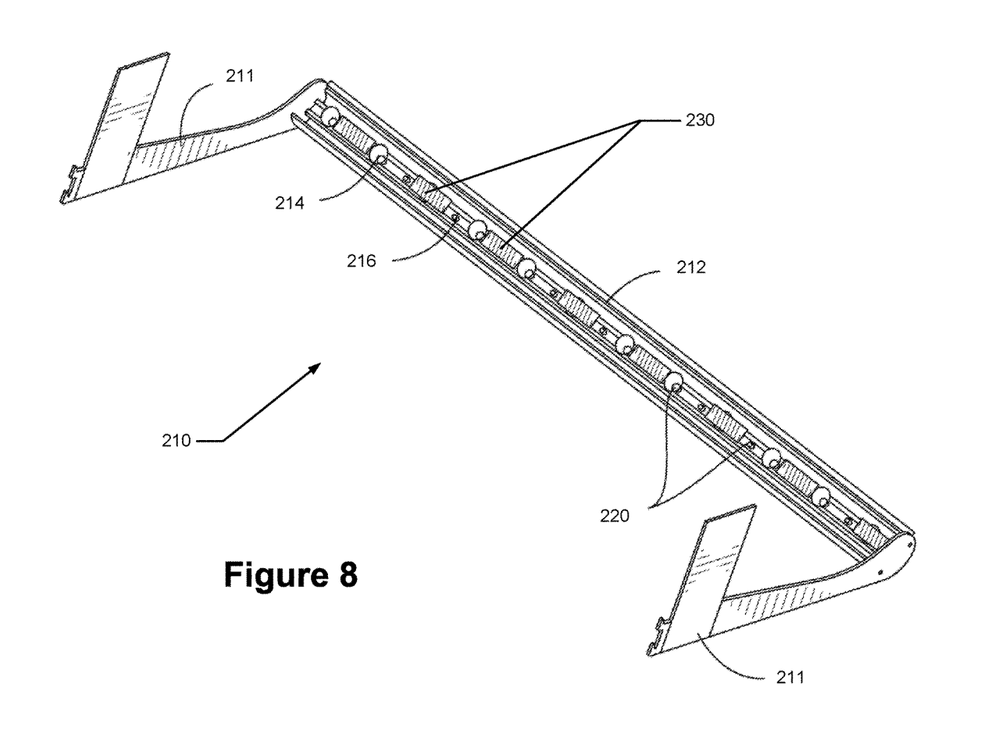
FIG. 8 shows a bottom perspective view of another exemplary lighting assembly.

For a series of LEDs 220 on a lighting bar 212, the reflective surfaces 230 may be utilized at different and specified intervals throughout the series of LEDs 220. In one embodiment, one individual reflective surface 230 may be utilized for each of the LEDs 220 on the lighting bar 212. In another embodiment, one continuous reflective surface 230 may be utilized for all of the LEDs 220 on the lighting bar 212. In another embodiment and as illustrated in FIG. 8, one individual reflective surface 230 may be utilized on intermittent LEDs 220 on the lighting bar 212 at specified intervals throughout the series of LEDs. For example, if there are ten LEDs 220 on the lighting bar 212, there may be five reflective surfaces 230 utilized with five of the ten individual LEDs 220 on the lighting bar 212. Other combinations may be utilized without departing from this disclosure, such as ten LEDs 220 on the lighting bar 212 with three of the ten individual LEDs 220 covered with a reflective surface 230 or ten LEDs 220 on the lighting bar 212 with seven of the ten individual LEDs 220 covered with a reflective surface 230.

In conjunction with reflective surfaces 230, the LEDs 220 may also include a reflector or lens 214 positioned around one or more of the plurality of LEDs 220 on the lighting bar 212. The reflector or lens 214 may serve the purpose of focusing and/or directing the emitted light in a desired direction and angle, and then projected onto the reflective surfaces 230. The reflector or lens 214 may be positioned and oriented at any of the numerous possible angles to direct light in the desired direction.

It should be understood that other lighting configurations and combinations are possible with the lighting bar 212 to adequately direct light to the entire merchandise display system. For example, it is possible to vary and/or combine different configurations of reflectors and reflective surfaces over various LEDs 220 on the lighting bar 212. Also, it is possible for the lighting bar 212 to define other numerous shapes and configurations, depending on the type of shelf and merchandise display system on which the lighting bar 212 is used.

The modified light projected onto the products on the retail shelf is relatively consistent in brightness over the planar surface and adds sufficient relative brightness beyond the general store luminaire lighting to call attention to or highlight the product merchandised on the shelf. Also, utilizing the reflective surfaces and the lensing technique directs the available LED light such that the lighting pattern produced on the planar surface and the product faces is far more homogenous than that of a fluorescent system. Top, center, and lower product on the shelves is relatively evenly illuminated providing the desired effect for the consumer shopper. The modified light projected onto the products may increase shopper awareness of the products, better present the products, and increase the sales of products.

By capturing and directing a higher percentage of total light output from the LEDs using appropriate lensing and/or reflective surfaces, the illuminance per watt can be higher than is generally possible with a fluorescent light, adding to a further reduction in necessary power input to achieve the desired lighting effect and energy savings. Additionally, by reflecting a portion of the total light output from the LED using appropriate reflective surfaces, the light beams can be more efficiently utilized, thereby adding to an even further reduction in the necessary power input to achieve the desired lighting effect and energy savings.

The LED circuit board and housing is designed to be thermally efficient and to remove as much heat from the LED as possible. Projected life of the LEDs is on the order of 4-6 times than that of typical existing fluorescent lamps. This reduces service call frequency by four to five times and commensurate cost.

Cost savings from reduced energy use and fewer service calls, along with improved sales from better product presentation may offset the cost of replacing existing fluorescent fixtures with an LED lighting fixture.

The reader should understand that these specific examples are set forth merely to illustrate examples of the invention, and they should not be construed as limiting the invention. Many variations in the lighting assemblies may be made from the specific structures described above without departing from this invention.

While the invention has been described in detail in terms of specific examples including presently preferred modes of carrying out the invention, those skilled in the art will appreciate that there are numerous variations and permutations of the above described systems and methods. Thus, the spirit and scope of the invention should be construed broadly as set forth in the appended claims.

We claim:

1. A lighting assembly for a merchandise display comprising:
   a lighting bar;
   a circuit board assembly having a plurality of LEDs mounted to the lighting bar, wherein the plurality of LEDs project a light onto a merchandise display;
   a plurality of lenses covering certain of the plurality of LEDs, and wherein the lenses capture the light from their respective LEDs, modify a beam pattern emitted from their respective LED, and re-project the light emitted from the plurality of LEDs in a substantially even distribution vertically and wherein the plurality of lenses each individually fit over their respective LEDs and comprise two different lens types;
   a plurality of reflective surfaces adjacent to the plurality of LEDs, wherein the plurality of reflective surfaces divide the light thereby creating multiple light beams projecting from the LEDs, wherein the multiple beams include a first light beam in a first direction and a second light beam in a second direction different than the first direction; and
   wherein the two different lens types comprise different configurations that produce a spotlight beam pattern and an oval shaped beam pattern, such that the lenses producing the spotlight beam pattern are directed toward a bottom shelf of the merchandise display and the lenses producing the oval shaped beam pattern are directed at an upper area and a middle area of the merchandise display.

2. The lighting assembly of claim 1, wherein the lighting bar is configured to adjust the orientation of the plurality of LEDs mounted to the inside of the lighting bar.

3. The lighting assembly of claim 1, wherein the two different lens types are placed over the LEDs in an alternating pattern, and the alternating pattern of the plurality of lenses emit light from the lighting bar that covers the entire merchandise display, from a top shelf to a bottom shelf.

4. The lighting assembly of claim 1, wherein the plurality of lenses is arranged such that every other LED on the lighting bar is covered by a lens.

5. The lighting assembly of claim 1, wherein the LEDs are aligned in a substantially straight line.

6. The lighting assembly of claim 1, wherein the lenses are secured with a snap fit connection.

7. A merchandise display lighting method comprising:
arranging a plurality of LEDs on a circuit board located within a lighting bar, wherein the plurality of LEDs project a light onto a merchandise display;
securing a plurality of lenses to the circuit board;
placing the plurality of lenses over every other LED on the lighting bar so as to capture the light from a respective LED, modify a beam pattern emitted from the respective LED, and re-project the light emitted from the respective LED; and
providing two different lens types in the plurality of lenses and placing the two different lens types over the LEDs in an alternating pattern;
securing a plurality of reflective surfaces adjacent to the plurality of LEDs, wherein the plurality of reflective surfaces divide the light thereby creating multiple light beams projecting from the LEDs, wherein the multiple beams include a first light beam in a first direction and a second light beam in a second direction different than the first direction;
wherein the two different lens types comprise different configurations that produce a spotlight beam pattern and an oval shaped beam pattern, such that the lenses producing the spotlight beam pattern are directed toward a bottom shelf of the merchandise display and the lenses producing the oval shaped beam pattern are directed at an upper area and a middle area of the merchandise display; and
wherein every other LED on the lighting bar is uncovered.

8. The merchandise display lighting method of claim 7, further comprising adjusting the beam patterns with the lighting bar.

9. The merchandise display lighting method of claim 7, wherein the plurality of lenses are secured with a snap fit connection.

10. The merchandise display lighting method of claim 7, further comprising aligning the plurality of LEDs in a substantially straight line.

11. An LED lighting system for a merchandise display comprising:
a lighting bar;
a circuit board assembly having a plurality of LEDs mounted to the lighting bar, wherein the plurality of LEDs projects a light onto a merchandise display;
a plurality of lenses individually secured to the circuit board assembly, and
a plurality of reflective surfaces adjacent to the plurality of LEDs, wherein the plurality of reflective surfaces divide the light thereby creating multiple light beams projecting from the LEDs, wherein the multiple beams include a first light beam in a first direction and a second light beam in a second direction different than the first direction;
wherein the lenses capture the light from a respective LED, modify a beam pattern emitted from the respective LED, and re-project the light emitted from the plurality of LEDs in a substantially even distribution vertically, wherein the plurality of lenses comprise two different lens types and the two different lens types are placed over the LEDs in an alternating pattern; and
wherein the two different lens types comprise different configurations that produce a spotlight beam pattern and an oval shaped beam pattern, such that the lenses producing the spotlight beam pattern are directed toward a bottom shelf of the merchandise display and the lenses producing the oval shaped beam pattern are directed at an upper area and a middle area of the merchandise display.

12. The LED lighting system of claim 11, wherein the plurality of lenses is secured with a snap fit connection.

13. The LED lighting system of claim 11, wherein the lighting bar is adjustable and directs and aims light emitted from the plurality of LEDs.

14. The merchandise display lighting method of claim 7, wherein the plurality of reflective surfaces are curved mirrors.

15. The lighting assembly of claim 1, wherein the plurality of reflective surfaces are curved mirrors.

16. The LED lighting system of claim 11, wherein the plurality of reflective surfaces are curved mirrors.

* * * * *